US007317400B2

(12) United States Patent
Sato et al.

(10) Patent No.: US 7,317,400 B2
(45) Date of Patent: Jan. 8, 2008

(54) SELF LIGHT EMITTING TYPE DISPLAY MODULE, ELECTRONIC APPLIANCE LOADED WITH THE SAME MODULE AND VERIFICATION METHOD OF FAULTS IN THE SAME MODULE

(75) Inventors: Hiroyuki Sato, Yonezawa (JP); Kazuhiro Satoh, Yonezawa (JP); Takashi Goto, Yonezawa (JP)

(73) Assignee: Tohoku Pioneer Corporation, Tendo-shi (JP)

( * ) Notice: Subject to any disclaimer, the term of this patent is extended or adjusted under 35 U.S.C. 154(b) by 218 days.

(21) Appl. No.: 11/109,779

(22) Filed: Apr. 20, 2005

(65) Prior Publication Data

US 2005/0237211 A1 Oct. 27, 2005

(30) Foreign Application Priority Data

Apr. 23, 2004 (JP) ............................ 2004-128509

(51) Int. Cl.
*G08B 21/00* (2006.01)
*G01R 31/00* (2006.01)
*H02H 3/08* (2006.01)

(52) U.S. Cl. ...................... 340/635; 340/657; 340/664; 362/93.1; 324/500

(58) Field of Classification Search ..................... None
See application file for complete search history.

(56) References Cited

U.S. PATENT DOCUMENTS 7,075,766 B2 * 7/2006 Moyer et al. .............. 361/93.1
2002/0141125 A1 * 10/2002 Stafford ..................... 361/93.7
2002/0163514 A1 11/2002 Nagai et al.
2005/0196892 A1 * 9/2005 Yamagata et al. ............ 438/79

FOREIGN PATENT DOCUMENTS

JP 3437152 6/2003
WO WO 02/093186 A1 11/2002

OTHER PUBLICATIONS

European Search Report dated Aug. 17, 2006 issued in corresponding European Application No. EP 05 00 8547.

* cited by examiner

*Primary Examiner*—Julie Bichngoc Lieu
(74) *Attorney, Agent, or Firm*—Westerman, Hattori, Daniels & Adrian, LLP.

(57) ABSTRACT

Reverse bias voltage VM is applied to any one of self light emitting elements arranged on a light emitting panel 1 under detection mode. Current corresponding to weak current flowing to the element is supplied to a transistor Q3 by the operation of a current mirror circuit comprised of transistors Q1, Q2. The current mirror circuit is formed with the transistor Q3 as a control side current source transistor and transistors Q4 to Q7 as a controlled side current source transistor. The sizes of the controlled side current source transistors Q4 to Q7 are set to, for example, 1:2:4:8 with respect to the control side current source transistor Q3 so as to construct current amplifying means. Current value amplified by a current comparison type comparator 7 is compared with current value from a reference current source 8 and its output is latched by a latch circuit 9 and stored in a data register 10. If a weak current over a predetermined value flows when reverse bias voltage is applied to the self light emitting element, it is determined that a possibility that the self light emitting element turns into a light emission fault is high and notifying means is driven appropriately using data stored in the data register 10.

16 Claims, 5 Drawing Sheets

SELF LIGHT EMITTING TYPE DISPLAY MODULE, ELECTRONIC APPLIANCE LOADED WITH THE SAME MODULE AND VERIFICATION METHOD OF FAULTS IN THE SAME MODULE

BACKGROUND OF THE INVENTION

1. Field of the Invention

The present invention relates to a light emitting display panel using an organic EL (electroluminescence) element as a self light emitting type element and a self light emitting type display module provided with drive means for driving to light this. More particularly, the present invention relates to a self light emitting type display module provided with a function capable of detecting a state in which a lighting fault is generated in mainly the self light emitting element of the light emitting display panel or a state having a high possibility that the lighting fault may occur in the future and a verification method for the fault in the same module.

2. Description of the Related Art

A number of electronic appliances and the like provided currently include a display and the display is indispensable as a man-machine interface for machines supporting the information society. The aforementioned display has been demanded to have a stricter reliability than displays adopted in such consumer machines as portable phone and car audio appliance if it is used in fields in which display faults can influence on human life like for example, medical equipment and airplane gauges.

In an injection appliance, for example, if brightness leak phenomenon occurs in the scanning line direction in a numeral display portion indicating an amount of injection, such a problem that a displayed numeral cannot be recognized to be "0" or "8" can occur. Further, a pixel at a portion displaying a decimal point is not lit so that a numeric digit is displayed erroneously and as a consequence, there may occurs a problem that the numeral may be read out mistakenly without this point being noticed. User's continuous use of the aforementioned machine mistakenly recognized that the display in such a fault condition is in normal condition is extremely dangerous and needless to say, this may lead to a fatal problem.

Thus, the display used in the electronic appliances is inspected for the fault condition of each of the pixels disposed on a display panel in a half completed condition prior to shipment of a product and whether or not the fault level satisfies the standard of a product on which the display is to be loaded is judged (see, for example, Japanese Patent No. 3437152).

The invention disclosed in the Japanese Patent No. 3437152 intends to execute the evaluation of each pixel of the display panel in the half completed condition prior to the shipment and aims at providing an evaluation device capable of obtaining a highly reliable evaluation result using a detection drive circuit of the organic EL display.

Although if the evaluation device disclosed in the Japanese Patent No. 3437152 is used, such an effect that an initial fault of a product can be found out and an appropriate measure can be taken before the display panel having the fault is delivered to user can be enjoyed, this kind of the display has a problem that a new fault can be generated in pixels disposed on the display panel during an operation of the display unit after the product is shipped.

Thus, various measures have been taken to minimize the extent in which such a fault occurs to secure reliability. However, to solve the fault in the pixel generated during the operation of the display and a problem that a fault may occur in the aforementioned drive means or the like, there exist extremely many technical problems and it is almost difficult to provide a display module in which no aforementioned fault occurs after the product is shipped.

On the other hand, as for the self light emitting element having a diode characteristic represented by the organic EL element, it has been well known that generally it has a very high impedance characteristic when reverse bias is applied thereto. However, the inventor of this application has reached a finding that by verifying the impedance characteristic of the element when the reverse bias is applied precisely, a state having a high possibility that a lighting fault may occur in the future can be detected (there exists a latent fault factor).

SUMMARY OF THE INVENTION

An object of the present invention is to provide a self light emitting type display module capable of detecting a fault of a self light emitting element generated during the operation of a display, verifying a situation in which the element reaches a state having a high possibility that a light emission fault may occur and notifying user thereof appropriately depending on that situation and a verifying method for a fault in the same module.

The self light emitting type display module of the present invention to achieve the above-described object is, as described in a first aspect of the present invention, a self light emitting type display module comprising a light emitting display panel in which a plurality of pixels containing a self light emission element having diode characteristic is arranged at each intersection between a scanning line and a data line in matrix configuration, a self light emitting display unit comprising drive means for driving each self light emitting element on the light emitting display panel selectively and fault detecting means for detecting a fault in the self light emitting display unit, and this self light emitting type display module is characterized in that the fault detecting means includes: reverse bias voltage applying means for applying reverse bias voltage to a cathode side of the self light emitting element when the self light emitting element is in non light emitting state; current amplifying means for amplifying current flowing to the self light emitting element when the reverse bias voltage is applied to the cathode side of the self light emitting element; and current value detecting means for determining whether or not current value amplified by the current amplifying means is over a predetermined value, and a fault in the self light emitting type display module is detected by the current value detecting means.

Further, the verification method for a fault in the self light emitting type display module of the present invention to achieve the above-described object is, as described in a twelfth aspect of the present invention, a verification method for a fault in the self light emitting type display module comprising: a light emitting display panel in which a plurality of pixels containing a self light emission element having diode characteristic is arranged at each intersection between a scanning line and a data line in matrix configuration; a self light emitting display unit comprising drive means for driving each self light emitting element on the light emitting display panel selectively; fault detecting means for detecting a fault in the self light emitting display unit; and memory means for storing the result of detection by the fault detecting means, and this verification method is characterized in that the fault detecting means executes steps of: a reverse bias application step of applying reverse bias voltage to any single scanning line in the light emitting display panel; a current value determining step of by obtaining the value of current flowing through the self light emitting element in such a state in which the reverse bias voltage is applied through current amplifying means, determining whether or not the value of current flowing to that element is over a predetermined value; and a determination result storing step of storing a determination result obtained in the current value determining step in the memory means.

DESCRIPTION OF THE PREFERRED EMBODIMENTS

Hereinafter, the self light emitting display module of the present invention will be described as regards the embodiments shown in Figures. The self light emitting display module of the present invention comprises a light emitting display panel in which a plurality of self light emitting elements as pixels is arranged in a matrix configuration, a self light display unit comprised of drive means for driving to light each self light emitting element on this light emitting display panel selectively, fault detecting means for detecting a fault in the self light emitting display unit and memory means for storing this detection result. As an embodiment described below, an example in which an organic EL element employing organic material for its light emitting layer is adopted will be indicated.

The organic EL element is basically formed by laminating a transparent electrode, for example, constituting an anode on a transparent substrate of glass or the like, a light emitting layer containing organic compound and a metallic electrode constituting a cathode. Thus, this organic EL element can be replaced electrically with a configuration including a light emitting element having diode characteristic and a parasitic capacity component which is coupled with this light emitting element in parallel and it can be said that the organic EL is a capacitive light emitting element.

If light emitting drive voltage is applied to this organic EL element in the forward direction, charge corresponding to the electric capacity of that element flows into an electrode as displacement current and is accumulated. If a specific voltage (light emission threshold voltage=Vth) inherent of that element is exceeded, current begins to flow into the organic layer constituting the light emitting layer from one electrode (anode side of the diode component) and it is considered that light is emitted at an intensity parallel to this current.

On the other hand, generally the organic EL element is driven by constant current because its voltage/luminescence characteristic is unstable against changes in temperature although current/luminescence characteristic is stable to changes in temperature and the organic EL element deteriorates seriously when it receives over current there by reducing its light emission lifetime. As a display panel using such an organic EL element, a passive matrix type display panel in which the EL elements are arranged in the matrix configuration and an active matrix type display panel in which respective EL elements disposed in the matrix configuration are lit individually by a thin film transistor (TFT) have been proposed.

Figure 1:
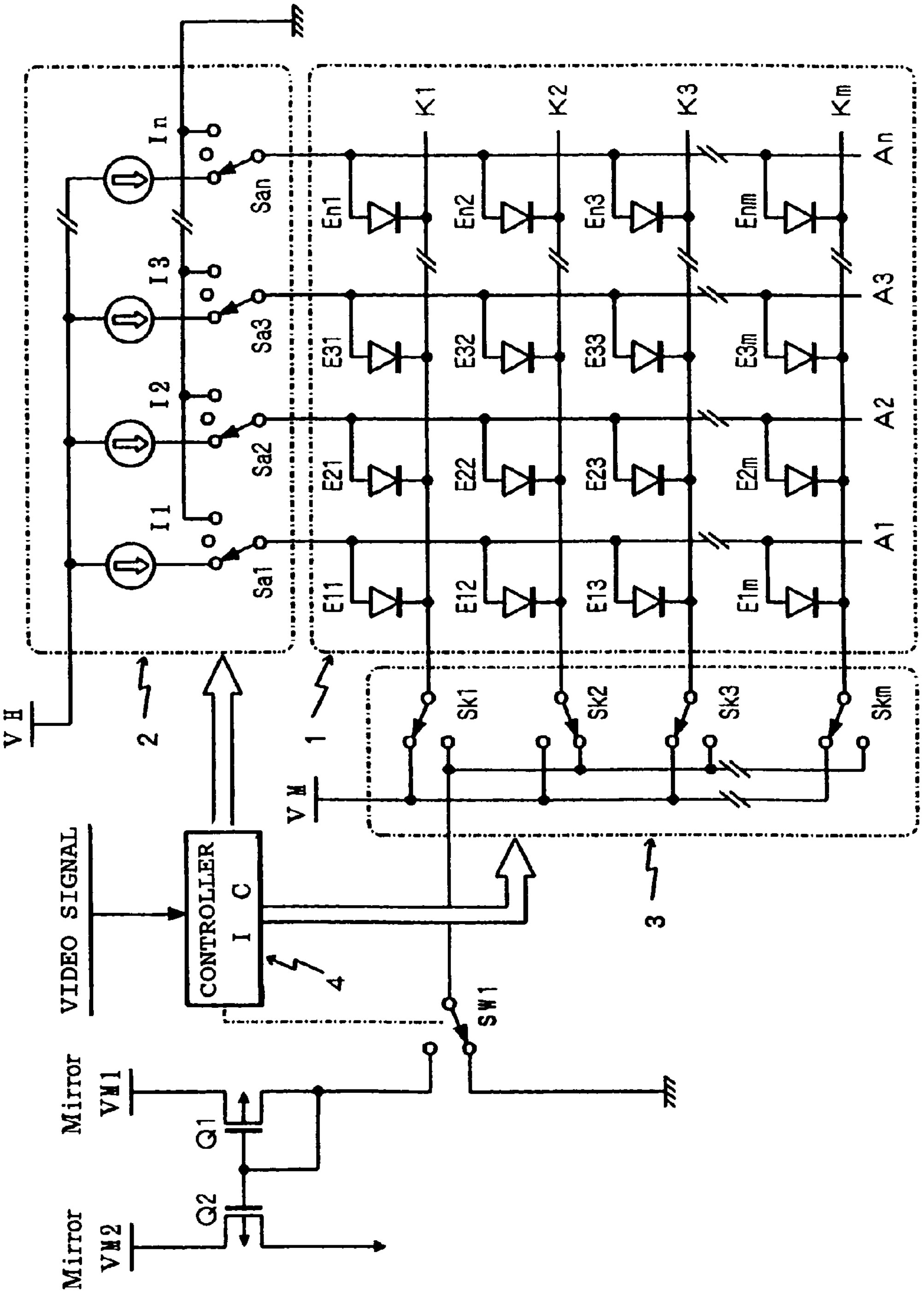
FIG. 1 is a circuit structure diagram showing a first embodiment of a self light emitting display unit of the present invention.

FIG. 1 shows a first embodiment of the self light emitting module of the present invention and this is indicated with an example in which the passive matrix type display panel is used. The organic EL element drive method in this passive matrix drive system includes two methods, cathode line scanning/anode line drive and anode line scanning/cathode line drive and the configuration shown in FIG. 1 indicates the configuration of the cathode line scanning/anode line drive. That is, anode line lines A1-An are arranged in the longitudinal direction (column direction) as n data lines and cathode line lines K1-Km are arranged in the lateral direction (row direction) as m scanning lines. Organic EL elements E11-Enm expressed with diode symbol mark are disposed at positions where they intersect (n×m positions in total), thereby constituting a display panel 1.

In each of the EL element E11-Enm constituting pixels, its one end (an anode terminal in an equivalent diode of an EL element) is connected to an anode line corresponding to each intersection position between the anode lines A1-An along the longitudinal direction and the cathode lines K1-Km along the lateral direction while the other end (a cathode terminal in an equivalent diode of an EL element) is connected to the cathode line. Each anode line A1-An is connected to an anode line drive circuit 2 as a data drive constituting lighting drive means and each cathode line K1-Km is connected to a cathode line scanning circuit 3 as a scanning driver constituting the lighting drive means and driven each.

The anode line drive circuit 2 is equipped with a constant current source I1-In and drive switches Sa1-San which is operated by using drive voltage VH provided from a boosting circuit (not shown) of, for example, a DC-DC converter. By connecting the drive switches Sa1-San to the side of the constant current sources I1-In, current from the constant current sources I1-In is supplied to respective EL elements E11-Enm disposed corresponding to the cathode line. The drive switches Sa1-San of this embodiment are so constructed that if no current from the constant current sources I1-In is supplied to individual EL elements, the respective anode lines can be connected to an open terminal or a ground GND as a reference potential point.

The cathode line scanning circuit 3 is provided with scanning switches Sk1-Skm corresponding to the respective cathode lines K1-Km so as to connect any one of reverse bias voltage VM for preventing cross-talk light emission or the aforementioned ground potential GND as a reference potential point via a switch SW1 to a corresponding cathode line. By connecting the constant current sources I1-In to desired anode lines A1-An while setting the cathode line at the reference potential point (ground potential) at a predetermined cycle, the respective EL elements are operated selectively to emit light.

Meanwhile, a control bus is connected to the anode line drive circuit 2 and the cathode line scanning circuit 3 from a controller IC4 containing CPU. The scanning switches Sk1-Skm and the drive switches Sa1-San are turned on/off based on a video signal supplied to the controller IC4. Consequently, constant current sources I1-In are connected to a desired anode line while the cathode scanning line is set at ground potential at a predetermined cycle based on video signal. Thus, the respective light emitting elements emit light selectively and an image based on the video signal is displayed on the display panel 1.

FIG. 1 shows a state in which the second cathode line K2 is set to ground potential so as to attain scanning condition. At this time, the reverse bias potential VM is applied to the cathode lines K1, K3-Km in non-scanning condition. Then, in the state shown in FIG. 1, all the drive switches Sa1-San are selected to the side of the respective constant current sources I1-In and therefore, the respective EL elements whose cathodes are connected to the second cathode line K2 are turned into lighting condition. On the other hand, if the EL element in the scanning condition is turned to non-lighting condition, the drive switches Sa1-San are connected to the ground GND side as a semi-potential point. Hereinafter, an example in which the self light emitting display unit is kept in light emitting drive mode will be described.

If the light emission drive mode is selected, when the forward direction voltage of the EL element in the scanning light emission state is VF, respective potentials are set up to have the relationship of [(forward direction voltage VF)−(reverse bias voltage VM)]<(light emission threshold voltage Vth). Consequently, a voltage less than the light emission threshold voltage Vh of the element is applied to each EL element connected to an intersection between a driven anode line and a cathode line not selected for scanning (cathode line in non-scanning condition), thereby preventing the EL element from cross-talk light emission.

Figure 2:
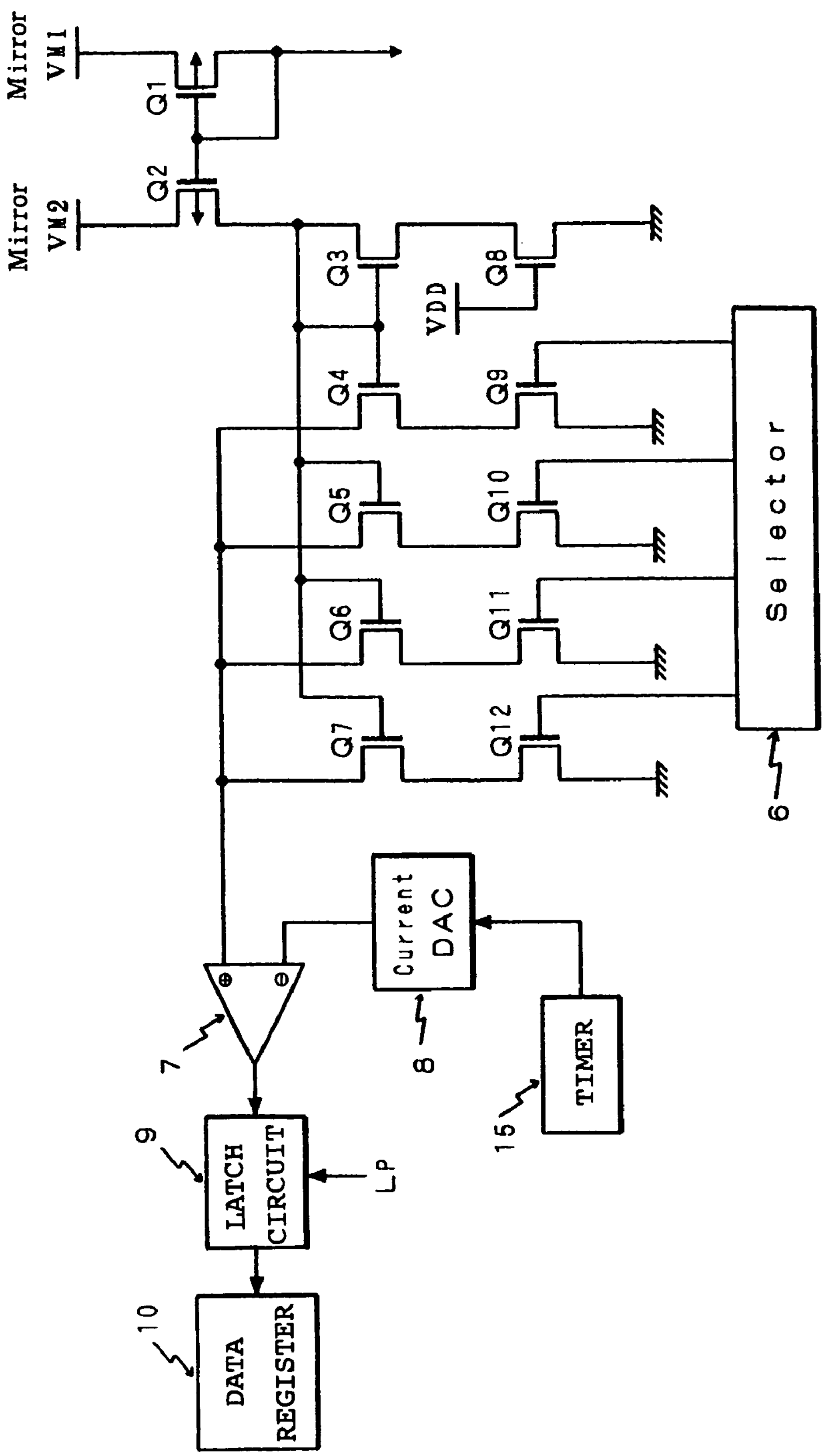
FIG. 2 is a circuit structure diagram for explaining a configuration example of detecting means for detecting a fault in the self light emitting display unit shown in FIG. 1 and memory means.

The self light emitting display unit is comprised of the light emitting display panel 1, the anode line drive circuit 2, the cathode line scanning circuit 3 and the controller IC4. Additionally, the self light emitting display module of the present invention includes fault detecting means for detecting a fault in the self light emission display unit and memory means for storing the result of detection by this fault detecting means as shown in FIG. 2. Then, the fault detecting means and the memory means function when detection mode described later is selected.

As shown in FIGS. 1, 2 in duplication, a current mirror circuit is constituted of P-channel type transistors Q1, Q2. This current mirror circuit will be referred to as a second current mirror circuit for convenience of explanation. This second current mirror circuit is so constructed that a power source VM1 for applying reverse bias voltage to the E1 elements disposed on the display panel 1 is supplied to the source electrode of the transistor Q1.

A power source VM2 is supplied to the source electrode of the transistor Q2 and used to supply mirror current (controlled current) to the drain of the transistor Q2. Generally, the power supplies VM1, VM2 are set to the same potential and preferably are set to a voltage higher than the reverse bias voltage VM used for preventing the cross-talk light emission.

The gate electrodes of the transistors Q1, Q2 in the second current mirror circuit are connected in common and short-circuit is made between the gate electrode and the drain electrode in the transistor Q1. Consequently, the transistor Q1 constitutes a control side current source transistors and the transistor Q2 constitutes a controlled side current source transistor.

When the aforementioned detection mode is selected, the switch SW1 shown in FIG. 1 is switched in an opposite direction to the Figure, namely, to the side of the second current mirror circuit. As a result, voltage form the power source VM1 is supplied to the cathode line scanning circuit 3 through the transistor Q1 and applied to any single cathode line as reverse bias voltage through the scanning switches Sk1-Skm as described later. Then, a current corresponding to the value of reverse bias current flowing at this time is supplied to the transistor Q2 in the second current mirror circuit as drain current.

Drain current flowing through the transistor Q2 is supplied to the source electrode of the n-channel type transistor Q3 as shown in FIG. 2. This transistor Q3 constitutes a current mirror circuit together with the n-channel type transistors Q4 to Q7. That is, the gate electrodes as control electrodes terminal of the transistors Q3 to Q7 are connected in common and short-circuit is formed between the source electrode and gate electrode of the transistor Q3. Consequently, the transistor Q3 constitutes the control side current source transistor and the transistors Q4 to Q7 constitute the controlled side current source transistor.

A transistor Q8 exists between the drain electrode and reference potential point of the transistor Q3 and a specified voltage, for example, logic operation power VDD is supplied to this transistor Q8. Therefore, the transistor Q8 functions as a load resistance of the control side current source transistor Q3 in the current mirror circuit. The respective source electrodes of transistors Q3 to Q7 which function as the respective controlled side current source transistors are connected in common and connected to a current input terminal (non-inverting input terminal) in the current comparison type comparator 7.

Transistors Q9 to Q12, which are switched on/off, are connected between the respective drain electrodes and reference potential point of the transistors Q4 to Q7 as the controlled side current source transistor. A control signal is supplied to the gate electrodes of the transistors Q9 to Q12 from a selector circuit 6 so that the transistors Q9 to Q12 are turned on selectively. That is, when the transistors Q9 to Q12 are turned on selectively, the transistors Q4 to Q7 in the current mirror circuit turn into positive operation condition selectively.

Here, the control side current source transistor Q3 and controlled side current source transistor Q4 in the current mirror circuit are in a relation that the transistor size is 1:n (where n≧1). That is, the current ratio between the transistors Q3 and Q4 is 1:n and there is constituted such current amplifying means for amplifying so that the controlled current flowing through the transistor Q4 (source suction current) is n times as the controll current (source current) flowing through the transistor Q3.

The transistors Q5-A7 which constitute the controlled side current source transistor are an, bn and cn times as the transistor size of the controlled side current source transistor Q3. Here, preferably, the aforementioned a, b, c are 2, 4, 8. Thus, respective source suction currents of n: 2n, 4n, 8n compared to the controll side current source transistor flow to the controlled side current source transistors Q4 to Q7 constituting the current mirror circuit.

Therefore, according to the embodiment shown in FIG. 2, by turning on the transistors Q9 to Q12 selectively according to a control signal from the selector circuit 6, the current amplifying means with the current mirror circuit can select a current amplification ratio of a width n-16n times.

Generally, current drive capacity called the aforementioned transistor size is determined based on a ratio between gate width and gate length (so-called gate W/L) in a unipolar transistor using the such as TFT like this embodiment. As well known, in case of bi-polar transistor, it is determined by the ratio of emitter area in its pn junction.

In this way, reverse bias current flown from the reverse bias power source VM1 to the side of the display panel is supplied to a current mirror circuit constituting current amplifying means through the second current mirror circuit constituted of the transistors Q1, Q2. Then, that current is converted by this current mirror circuit and supplied to the current input terminals (non-inverting input terminals) of the current comparison type comparator 7 as suction current.

On the other hand, a current from the reference current source 8 is applied to other current input terminal (inverting input terminal) in the current comparison type comparator 7. The current comparison type comparator 7 of this embodiment operates to suck the reference current into the side of the reference current source 8 from the inverting input terminal. The reference current source 8 functions to generate a corresponding suction current by inputting digital data. Therefore, by changing setting of the digital data, the value of the reference current to be applied to the comparator 7 can be changed.

When a larger current flows to the side of the non-inverting input terminal as compared with a current value in the reference current source 8, the status of the current comparison type comparator 7 is inverted and operated to generate "+" (plus) voltage output. Therefore, this comparator 7 constitutes current value detecting means for determining whether or not current value at the non-inverting input terminal is over a predetermined value.

The output of the comparator 7 is supplied to a latch circuit 9 and the output of the comparator 7 is latched by a latch pulse LP inputted to this latch circuit 9. Each latch output by the latch circuit 9 is supplied to a data register 10 which constitutes the memory means and can be stored in the data register 10. Reference numeral 15 in FIG. 2 denotes a timer and as this timer 15, if a display unit of this embodiment is loaded on an electronic appliance, a timer provided in that electronic appliance is expected.

That is, the timer 15 has a function for accumulating use time of the electronic appliance (use time of display unit also) and the setting of the digital data provided to the reference current source 8 is changed with a passage of the use time so as to change the value of a reference current applied to the current comparison type comparator 7 gradually. Its reason will be described in detail later.

If reverse bias is applied to the organic EL element as described above, generally, a very high impedance characteristic is indicated. In the meantime, the inventor and other people related to the present invention have found that whether or not a given element can reach a light emission fault in the future (there exists a latent fault factor) can be determined by measuring the value of current flowing slightly through the element when reverse bias voltage is applied to the element, from various kinds of verifications including environmental acceleration test results which will be described later.

Thus, before explaining the operation of the fault detecting means described based on FIG. 2, it is important to describe the generating condition of such fine current when the reverse bias is applied to the element in advance and this point will be described with reference to FIGS. 4, 5.

In this kind of the EL element, basically as described above, the transparent electrode constituting an anode, the light emission layer containing organic compound and the metallic electrode, for example, constituting the cathode are formed successively on a transparent substrate. Because of this configuration, for example, if part of the light emission layer is formed thin due to a fault in the formed layer or a physical change occurs in the electrode or light emission layer due to changes with time passage, a change occurs in insulation performance between both the electrodes so that a change is generated in the value of current flowing slightly in the application direction of the reverse bias voltage. If such a phenomenon occurs in an extreme condition, the element is short-circuited or gets in a similar state (leak condition) and as a consequence, the element becomes incapable of lighting.

Figure 4:
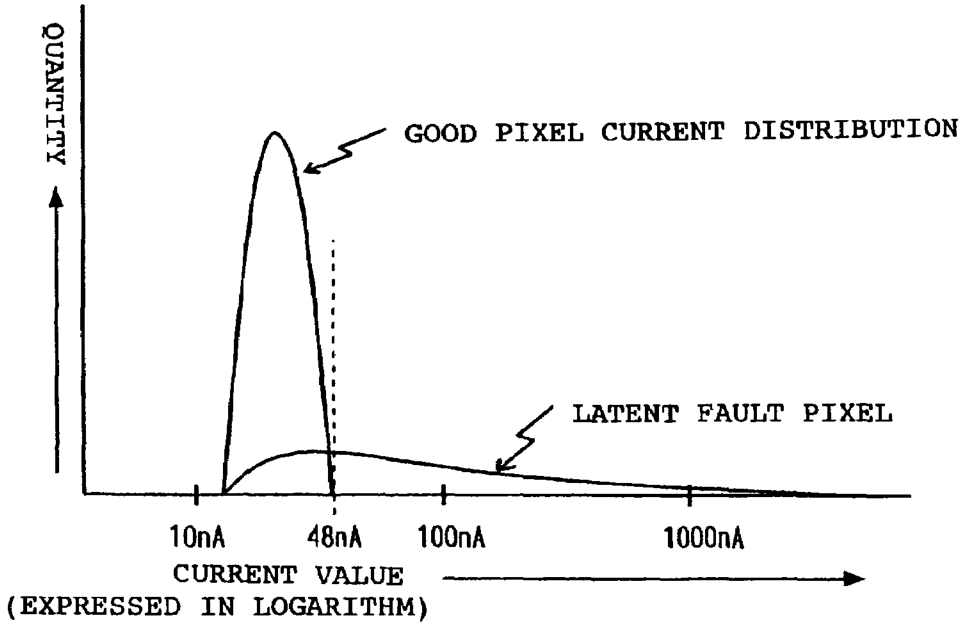
FIG. 4 is a distribution characteristic diagram of the value of current flowing through an acceptable pixel and unacceptable pixel in case where reverse bias voltage is applied.

Then, FIG. 4 shows a result of measurement of initial values when the reverse bias voltage of 10.0 V is applied to each of the organic EL elements in which the area of a single pixel is formed in 0.3 mm×0.28 mm. Good pixels which do not reach leakage after the environmental acceleration test is performed under the above-mentioned condition indicate substantially normal distribution around 30 nA at the initial measurement. On the other hand, the pixels which reach leakage after the environmental acceleration test is performed are pixels having a latent fault factor and are distributed widely from 20 nA to several thousands nA at the initial setting. Therefore, if 48 nA or more, which corresponds to +6 σ, is regarded as a pixel having a latent fault factor in the current distribution of good pixels at the initial measurement shown in FIG. 4, about 80% of pixels which turn to wrong products can be detected preliminarily.

Figure 5:
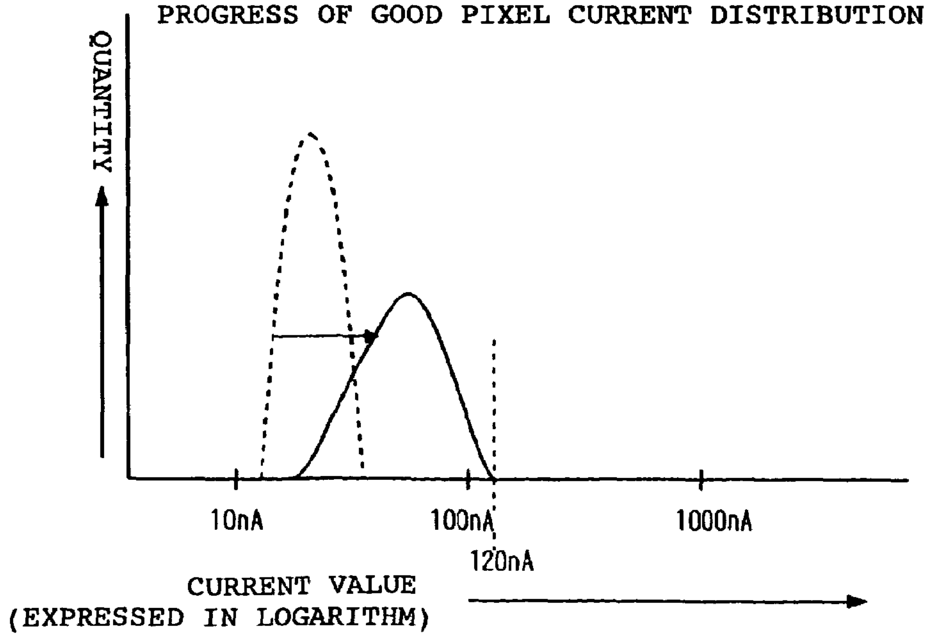
FIG. 5 is a characteristic diagram for explaining progress in the distribution characteristic of the acceptable pixel.

On the other hand, the inventor and other people have verified that the current distribution of good pixels moves in a direction indicated with an arrow with a time passage as shown in FIG. 5. Thus, if the display unit is delivered to user and it is intended to detect an element having a fault display unit or an element having a high possibility that the display unit may turn into a fault during a use, the necessity of changing a determination standard occurs with a passage of the use time of the display unit. That is, it is recommended to change the aforementioned standard with a passage of the use time of the display unit and regard a pixel in which reverse bias current of 120 nA or more as a pixel having a latent fault factor ultimately.

Referring to FIG. 2, the data register as fault detecting means shown in FIG. 2 and as memory means which stores a result of detection by this fault detecting means is operated under the detection mode, which will be explained below. This detection mode is switched, for example, when the operation power is turned on or periodically with the operating power kept on or at an arbitrary timing by artificial operation from outside.

If the detection mode is selected, the switch SW shown in FIG. 1 is switched to an opposite direction to FIG. 1, that is, to the side of the second current mirror circuit based on an instruction from the controller IC4. According to an instruction from the controller IC4, any single one of the scanning switches Sk1-Skm in the cathode line scanning circuit 3 is connected to a line on the switch SW1 side. According to an instruction from the controller IC4, any single one of the drive switches Sa1-San in the anode line drive circuit 2 is connected to the ground while the other drive switch is turned to an open terminal.

Consequently, reverse bias voltage is applied to a single EL element disposed on the display panel 1 by the power source VM1. At this time, current corresponding to the value of a fine reverse bias current flowing to the single EL element is supplied to the transistor Q3 constituting a current mirror circuit as current amplifying means through the second current mirror circuit. As a result, source currents from the respective transistors Q4 to Q7 selected and turned into active condition by the selector circuit 6 flow from the comparator 7 as suction current.

This suction current is a result of amplifying current by n-16n times (n≧1) by selection of the selector circuit 6 and the comparator 7 generates an output based on the result of comparison with the value of current supplied to this. At this time, a latch pulse LP is supplied to the latch circuit 9 and latch data at this time is stored in the data register 10 as memory means.

If the EL element of which reverse bias voltage VM is applied to reaches leak status, the value of current amplified and supplied to the comparator 7 is saturated and data stored in the data register 10 indicates a fault (defect). If a current value by the reference current source 8 is set up as reverse bias current corresponds to, for example, 48 nA as described with reference to FIG. 4, even if a latent fault factor exists in a measured element, data indicating the fault is stored in the data register 10.

As described with reference to FIG. 5, since the current distribution of good pixels moves to a higher current region with a passage of time, it is desired to set in such a manner that the reference current value by the reference current source 8 is increased gradually based on a computation value by the timer 15. A setting example in which a pixel is regarded as a fault in such a level from 48 nA to 120 nA or more ultimately as described above is quite critical an example and it is desirable to make setting having an appropriate allowance depending on a determination accuracy demanded from viewpoints of the characteristic of an electronic appliance which it is loaded on.

The above explanation shows a case where a fault in an EL element corresponding to one element is verified and by changing the connecting condition of the scanning switches Sk1-Skm and the drive switches Sa1-San successively, the same verification is implemented on each EL element and its verification result is stored in the data register 10. In the meantime, if the individual EL elements are verified continuously in such a way, no image can be displayed on the display panel in this interval. Thus, by verifying a single EL element in each interval of a frame (or a sub-frame) or an EL element corresponding to a single cathode line, it is substantially possible to avoid a state in which an image is not displayed.

Figure 3:
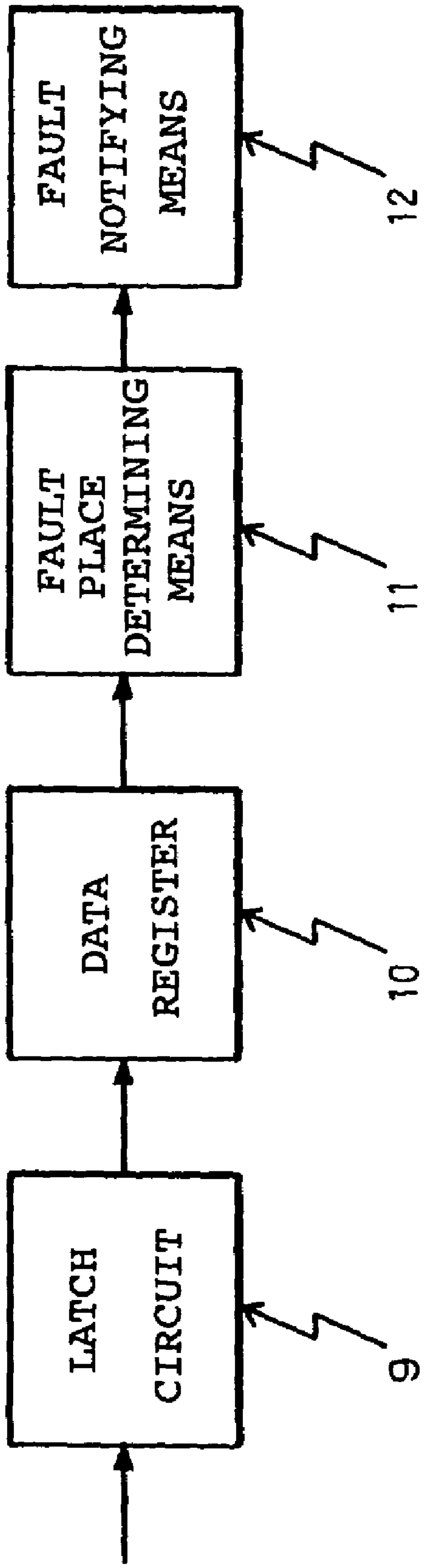
FIG. 3 is a block diagram showing a connection configuration example of a fault place determining means and fault notifying means using data stored in the memory means.

FIG. 3 shows a configuration in which by specifying a place where a fault (defect) exists based on the verification result stored in the data register 10 in the above-mentioned manner, fault notifying means can be operated correspondingly. That is, reference numerals 9, 10 shown in FIG. 3 denote a latch circuit and data register shown in FIG. 2 as well and each data stored in the data register 10 is used at fault position determining means shown by reference numeral 11. Then, the fault notifying means 12 is driven corresponding to a fault position determined by the fault position determining means 11.

A latch output corresponding to each EL element is stored in the data register 10 as described previously and these are stored in such a condition that they are expanded in a map-like fashion for each scanning line and data line. Therefore, depending on a place (coordinate value) of the EL element disposed on the display panel and verification result, a fault EL element or an EL element having a high possibility that light emission fault may occur in the future can be specified.

The fault notifying means 12 is driven corresponding to a fault position determined by the fault position determining means 11. In this case, even if such a pixel position having a high possibility that a fault may occur in the future is detected, if that position is a place having a low possibility that its display may be recognized mistakenly, the current can be used continuously without operating the fault notifying means 12. If that position is, for example, a place where the decimal point is expressed, even if the quantity of related pixels is slight, the necessity of operating the fault notifying means 12 occurs. If the quantity of pixels which can lead to a fault in the future reaches over a predetermined one, it is permissible to adopt an operation by driving the fault notifying means 12. The above-described operation is desired to be selected appropriately depending on an apparatus on which this self light emitting display module is loaded.

As the fault notifying means 13, it is permissible to adopt means for notifying audibly like a buzzer or display a fixed message on the display panel 1. Alternatively, it is possible to indicate that the self light emitting module is in f ault clearly by turning off the display of the display panel 1. In this case, if the display is not permitted to be turned of f like a gauge used in airplane, it is permissible to adopt means for changing the display position appropriately.

Figure 6:
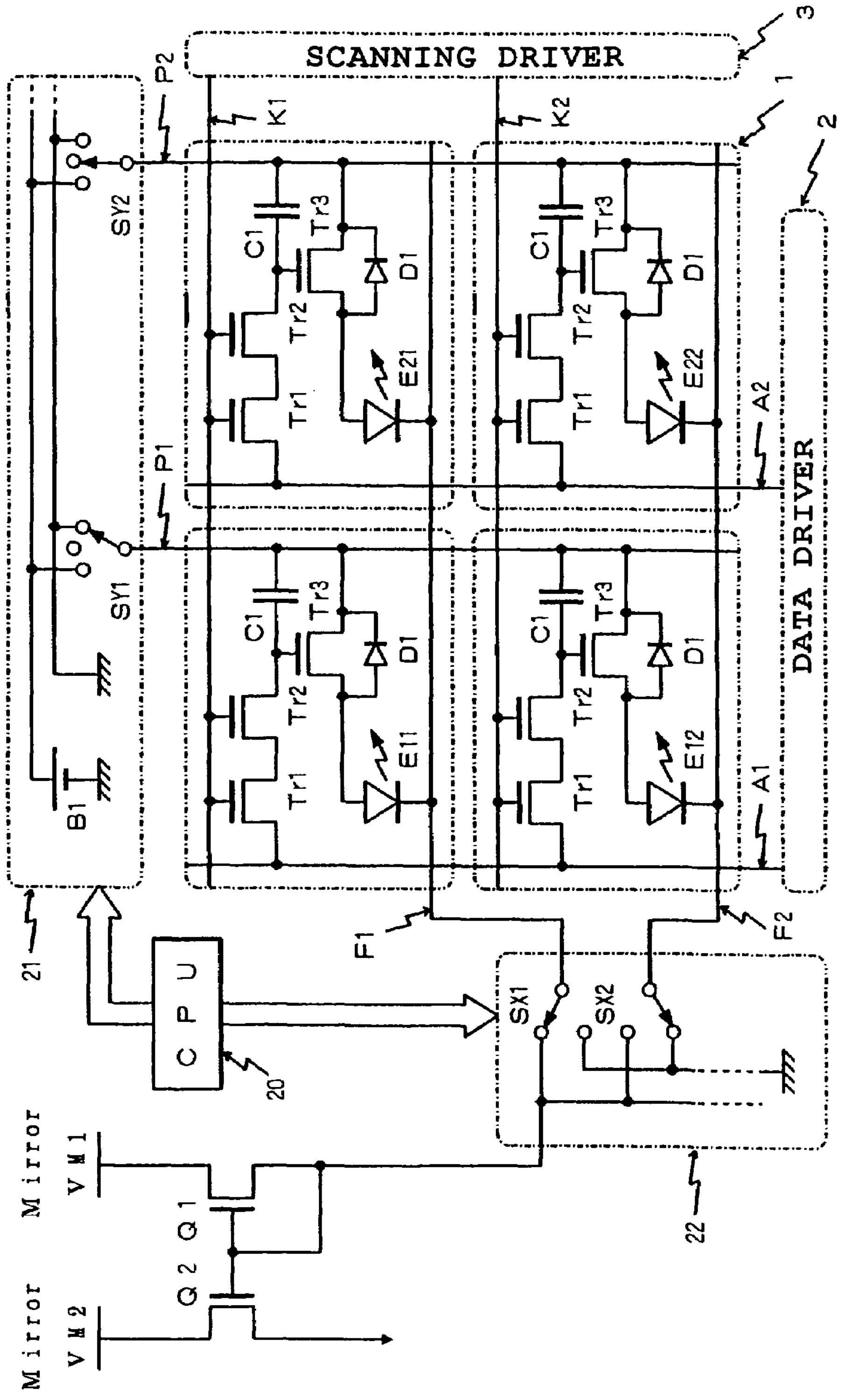
FIG. 6 is a circuit structure diagram showing a second embodiment of the self light emitting display unit of the present invention.

Although the above-described embodiment indicates an example in which the present invention is applied to a self light emitting type display module using the passive matrix type display panel, the present invention can also be applied to a self light emitting type display module using active matrix type display panel. FIG. 6 shows an example in which the present invention is applied to the self light emitting type display module using the active matrix type display panel and portions corresponding to the already mentioned components are expressed with same reference numerals.

In the display panel 1 of this embodiment shown in FIG. 6, a number of data electrode lines A1, A2, . . . to which data signal corresponding to video data from the data driver 2 are supplied are arranged in the column direction and a number of power source supply lines P1, P2, . . . are also arranged in parallel to the data electrode lines. On the other hand, a number of scanning electrode lines K1, K2, . . . to which a scanning signal from the scanning driver 3 is supplied are arranged in the row direction and a number of power control lines F1, F2, . . . are also arranged in parallel to the scanning electrode lines.

As for the circuit configuration including an EL element E1 corresponding to a unit light emission element, a control transistor, a drive transistor and a capacitor are provided. In the meanwhile, according to the embodiment shown in FIG. 6, first and second transistors Tr1, Tr2 are employed as a control transistor and a scanning signal for scanning the row is supplied to each gate of these successively through the scanning electrode lines K1, K2, . . .

According to this embodiment, the source and drain of the first and second control transistors Tr1, Tr2 are connected directly. Then, the source of the first control transistor Tr1 is connected to the data electrode lines A1, A2, . . . and the drain of the second control transistor Tr2 is connected to the gate of the drive transistor Tr3 and at the same time an end of a capacitor C1.

The other end of the capacitor C1 and the source of the drive transistor Tr3 are connected to the power source supply lines P1, P2, . . . and the drain of the drive transistor Tr3 is connected to an anode terminal of an EL element E1. Then, the cathode terminal of the EL element E1 is connected to the power control lines F1, F2, . . . According to this embodiment, a diode D1 is connected to between the drain and source of each drive transistor Tr3 in a direction indicated in FIG. 6.

This operates the fault detecting means as described later and becomes conductive when reverse bias voltage is applied to the EL element E1 and then, it is used for bypassing the drive transistor Tr3. A configuration corresponding to four pixels are expressed in FIG. 6 for the reason of drawing area and the above-described circuit configurations are structured in the same way corresponding to each organic EL element E1 disposed in the display panel 1.

As for the light emission control operation for a unit pixel in the display panel 1 in which such circuits are disposed in multiple quantities in the row and column directions, ON voltage is supplied to the gates of the first and second control transistors Tr1, Tr2 through the scanning electrode lines K1, K2, . . . in an address period. Consequently, a current corresponding to video data signal supplied via the data electrode lines A1, A2, . . . is fed to the capacitor C1 through the source and drain of each of the transistors Tr1, Tr2, . . . connected in series so that the capacitor C1 is charged. Then, the charging voltage is supplied to the gate of the drive transistor Tr3 and the transistor Tr3 allows a current corresponding to its gate voltage and a control voltage (ground voltage in this embodiment) supplied to the power control lines F1, F2, . . . to flow to the organic EL element E1, so that the EL element E1 emits light.

On the other hand, when the gate voltage of the control transistors Tr1, Tr2 turns to OFF voltage, the transistors Tr1, Tr2 turn to so-called cut-off state. However, the gate voltage of the drive transistor Tr3 is held by charges accumulated in the capacitor C1. Then, a drive current to the organic EL element E1 by the drive transistor Tr3 is maintained until a next addressing time and consequently, light emission of the EL element E1 is maintained.

The configuration shown in FIG. 6 includes fault detecting means for detecting a light emission fault in the self light emitting display module as well as the self light emitting display module containing the light emitting display panel 1, the data driver 2 and the scanning driver 3. That is, this fault detecting means includes a control circuit 20 containing CPU, a power source block 21 and a reverse bias voltage supplying block 22. The reverse bias voltage supplying block 22 is so constructed to be supplied with current from the power source VM1 in the current mirror circuit of the transistors Q1, Q2.

The current mirror circuit in the transistors Q1, Q2 shown in FIG. 6 has the same circuit configuration as the second current mirror circuit shown in FIGS. 1, 2 and a mirror output current by the transistor Q2 is supplied to the control side current source transistor Q3 constituting the current mirror circuit shown in FIG. 2. That is, according to the embodiment shown in FIG. 6 also, the circuit configuration shown in FIGS. 2, 3 is used as it is.

In the power source block 21, when light emission drive mode for driving the display panel 1 to light is selected, drive voltage from the power source B1 is supplied to each of the power source supply lines P1, P2, . . . through the switches SY1, SY2, . . . At this time, respective switches SX1, SX2, . . . in the reverse bias voltage supply block 22 are connected to the ground side. Consequently, respective pixels arranged on the display panel 1 are driven to light selectively as described previously.

When a detection mode for detecting a fault in the pixel on the display panel is selected, reverse bias voltage is supplied to any one of the EL elements E1 as described previously. The state shown in FIG. 6 expresses a state in which the reverse bias voltage is applied to an EL element E11 constituting a pixel on the left upper in the same Figure and the control circuit 20 containing the CPU switches a switch SX1 in the reverse bias voltage supply block 22 to the side of current mirror circuit comprised of the transistors Q1, Q2. The control circuit 20 connects the switch SY1 of the power source block 21 to ground while setting other switch to an open terminal.

Consequently, current from the power source VM1 provided to the transistor Q1 in the current mirror circuit flows through a path comprising a switch SX1 in the reverse bias voltage supply block 22, the power source control line F1, the EL element E11, the diode D1, the power source line P1 and the switch SY1 in the power source block 21. A current at this time flows to the drain of the transistor Q2 as mirror current (controlled current) and verification on an EL element corresponding to a single pixel on the display panel is implemented with the configuration shown in FIG. 2. In the meantime, this verification operation is the same as the verification operation already explained based on FIG. 2.

The verification operation is carried out by changing combinations of connections between the switches SX1, SX2, . . . in the reverse bias voltage supply block 22 and the switches SY1, SY2, . . . in the power source block 21, so that whether or not any fault exists in all the EL elements constituting each pixel can be verified. Then, the fault notifying means 12 is driven using data stored in the data register 10 and this operation is the same as the operation already described based on FIG. 3.

Although according to the embodiment described above, the organic EL element is employed as the self light emission element, this is not limited to the organic EL element and it is permissible to use other self light emission element having diode characteristic. The self light emitting type display module containing the fault detecting means can be applied not only to electronic appliances containing medical appliances and airplane gauges as described previously but also other electronic appliances which require this kind of the light emitting display panel, so that the operation and effect already described can be enjoyed as it is.

What is claimed is:

1. A self light emitting type display module comprising a light emitting display panel in which a plurality of pixels containing a self light emission element having diode characteristic is arranged at each intersection between a scanning line and a data line in matrix configuration, a self light emitting display unit comprising drive means for driving each self light emitting element on the light emitting display panel selectively and fault detecting means for detecting a fault in the self light emitting display unit, wherein the fault detecting means includes:

reverse bias voltage applying means for applying reverse bias voltage to a cathode side of the element when the self light emitting element is in non light emitting state;

current amplifying means for amplifying current flowing to the self light emitting element when the reverse bias voltage is applied to the cathode side of the self light emitting element; and current value detecting means for detecting a fault in the self light emitting display unit by determining whether or not current value amplified by the current amplifying means is equal to or more than a predetermined value, and the current amplifying means is constituted of a current mirror circuit set to a predetermined current ratio (1:n, where $n \geqq 1$) between a control side current source transistor and a controlled side current source transistor and current generated when reverse bias voltage is applied to the cathode side of the self light emitting element is supplied to the control side current source transistor while current flowing to the controlled side current source transistor is supplied to the current value detecting means.

2. The self light emitting type display module according to claim 1, wherein control pole terminals are connected to the current mirror circuit constituting the current amplifying means in common and plural controlled side current source transistors having different transistor sizes are provided and by operating actively the controlled side current source transistor selectively, a current amplification ratio of the current amplifying means is capable of being selected.

3. The self light emitting type display module according to claim 1 or 2, wherein current generated when reverse bias voltage is applied to the cathode side of the self light emitting element is supplied to the control side current source transistor in the current mirror circuit through a second current mirror circuit.

4. The self light emitting type display module according to claim 1, wherein the current value detecting means is constituted of a current comparison type comparator and current by the current amplifying means is supplied to one current input terminal of the current comparison type comparator while current from a reference current source is supplied to the other current input terminal.

5. The self light emitting type display module according to claim 4, wherein current value from the reference current source supplied to the other current input terminal of the current comparison type comparator is changeable.

6. A self light emitting type display module comprising a light emitting display panel in which a plurality of pixels containing a self light emission element having diode characteristic is arranged at each intersection between a scanning line and a data line in matrix configuration, a self light emitting display unit comprising drive means for driving each self light emitting element on the light emitting display panel selectively and fault detecting means for detecting a fault in the self light emitting display unit, wherein the fault detecting means includes:

reverse bias voltage applying means for applying reverse bias voltage to a cathode side of the element when the self light emitting element is in non light emitting state;

current amplifying means for amplifying current flowing to the self light emitting element when the reverse bias voltage is applied to the cathode side of the self light emitting element; and current value detecting means for detecting a fault in the self light emitting display unit by determining whether or not current value amplified by the current amplifying means is equal to or more than a predetermined value, and the drive means is capable of being switched between light emission drive mode and detection mode and by applying reverse bias voltage to any single one of the scanning lines while connecting any one of the data lines to a reference potential point under the detection mode, reverse bias voltage is applied to the cathode side of the self light emission element corresponding to a single pixel.

7. A self light emitting type display module comprising a light emitting display panel in which a plurality of pixels containing a self light emission element having diode characteristic is arranged at each intersection between a scanning line and a data line in matrix configuration, a self light emitting display unit comprising drive means for driving each self light emitting element on the light emitting display panel selectively and fault detecting means for detecting a fault in the self light emitting display unit, wherein the fault detecting means includes:

reverse bias voltage applying means for applying reverse bias voltage to a cathode side of the element when the self light emitting element is in non light emitting states;

current amplifying means for amplifying current flowing to the self light emitting element when the reverse bias voltage is applied to the cathode side of the self light emitting element; and current value detecting means for detecting a fault in the self light emitting display unit by determining whether or not current value amplified by the current amplifying means is equal to or more than a predetermined value, and the fault detecting means is carried out for all combinations of respective scanning lines and respective data lines corresponding to each pixel on the light emitting display panel and a detection result based on the detection operation is stored in the memory means.

8. A self light emitting type display module comprising a light emitting display panel in which a plurality of pixels containing a self light emission element having diode characteristic is arranged at each intersection between a scanning line and a data line in matrix configuration, a self light emitting display unit comprising drive means for driving each self light emitting element on the light emitting display panel selectively and fault detecting means for detecting a fault in the self light emitting display unit, wherein the fault detecting means includes:

reverse bias voltage applying means for applying reverse bias voltage to a cathode side of the element when the self light emitting element is in non light emitting state;

current amplifying means for amplifying current flowing to the self light emitting element when the reverse bias voltage is applied to the cathode side of the self light emitting element; and current value detecting means for detecting a fault in the self light emitting display unit by determining whether or not current value amplified by the current amplifying means is equal to or more than a predetermined value, and notifying means is driven based on the result of detection by the fault detecting means stored in the memory means.

9. A self light emitting type display module comprising a light emitting display panel in which a plurality of pixels containing a self light emission element having diode characteristic is arranged at each intersection between a scanning line and a data line in matrix configuration, a self light emitting display unit comprising drive means for driving each self light emitting element on the light emitting display panel selectively and fault detecting means for detecting a fault in the self light emitting display unit, wherein the fault detecting means includes:

reverse bias voltage applying means for applying reverse bias voltage to a cathode side of the element when the self light emitting element is in non light emitting state;

current amplifying means for amplifying current flowing to the self light emitting element when the reverse bias voltage is applied to the cathode side of the self light emitting element; and current value detecting means for detecting a fault in the self light emitting display unit by determining whether or not current value amplified by the current amplifying means is equal to or more than a predetermined value, and the self light emitting elements arranged on the light emitting display panel are organic EL elements in which organic compound is utilized in its light emission layer.

10. An electronic appliance loaded with a self light emitting type display module according to claim 1.

11. A verification method for a fault in the self light emitting type display module comprising:

a light emitting display panel in which a plurality of pixels containing a self light emission element having diode characteristic is arranged at each intersection between a scanning line and a data line in matrix configuration;

a self light emitting display unit comprising drive means for driving each self light emitting element on the light emitting display panel selectively;

fault detecting means for detecting a fault in the self light emitting display unit; and memory means for storing the result of detection by the fault detecting means, wherein the fault detecting means executes steps of:

a reverse bias application step of applying reverse bias voltage to any single scanning line in the light emitting display panel;

a current value determining step of by obtaining the value of current flowing through the self light emitting element in such a state in which the reverse bias voltage is applied through current am in means constituted of a current mirror circuit set to a predetermined current ratio (1:n, where n≧1) between a control side current source transistor, determining whether or not the value of current flowing to that element is equal to or more than a predetermined value; and a determination result storing step of storing a determination result obtained in the current value determining step in the memory means.

12. The verification method for a fault in the self light emitting type display module according to claim 11, wherein the reverse bias voltage application step, current value determining step and determination result storing step are executed for each of all combinations of respective scanning lines and respective data lines corresponding to the each pixel.

13. The self light emitting type display module according to claim 9, wherein the current value detecting means is constituted of a current comparison type comparator and current by the current amplifying means is supplied to one current input terminal of the current comparison type comparator while current from a reference current source is supplied to the other current input terminal.

14. The self light emitting type display module according to claim 13, wherein current value from the reference current source supplied to the other current input terminal of the current comparison type comparator is changeable.

15. The self light emitting type display module according to claim 13 or 14, wherein the detecting operation of the fault detecting means is carried out for all combinations of respective scanning lines and respective data lines corresponding to each pixel on the light emitting display panel and a detection result based on the detection operation is stored in the memory means.

16. An electronic appliance loaded with a self light emitting type display module according to any one of claims 13 to 15.

* * * * *

UNITED STATES PATENT AND TRADEMARK OFFICE

CERTIFICATE OF CORRECTION

PATENT NO. : 7,317,400 B2 
APPLICATION NO. : 11/109779
DATED : January 8, 2008
INVENTOR(S) : Hiroyuki Sato et al.

It is certified that error appears in the above-identified patent and that said Letters Patent is hereby corrected as shown below:

In the Claims;
In claim 11 on line 35 of column 15 change "… current am in means constituted …" to be --… current amplifying means constituted …--
Also in claim 11 on line 1 of column 16 change "source transistor, determining …" to be --source transistor and a controlled side current source transistor, determining …--

Signed and Sealed this

Second Day of September, 2008

JON W. DUDAS
*Director of the United States Patent and Trademark Office*